United States Patent
Carlin et al.

(10) Patent No.: US 9,157,142 B2
(45) Date of Patent: Oct. 13, 2015

(54) PROCESS FOR THE VAPOR PHASE ALUMINIZATION OF A TURBOMACHINE METAL PART AND DONOR LINER AND TURBOMACHINE VANE COMPRISING SUCH A LINER

(75) Inventors: Maxime Francois Roger Carlin, Paris (FR); Lucie Marie Ida Lanciaux, Paris (FR)

(73) Assignee: SNECMA, Paris (FR)

(*) Notice: Subject to any disclaimer, the term of this patent is extended or adjusted under 35 U.S.C. 154(b) by 0 days.

(21) Appl. No.: 13/473,200

(22) Filed: May 16, 2012

(65) Prior Publication Data
US 2012/0224975 A1 Sep. 6, 2012

Related U.S. Application Data

(62) Division of application No. 12/245,052, filed on Oct. 3, 2008, now Pat. No. 8,202,574.

(30) Foreign Application Priority Data

Oct. 3, 2007 (FR) ..................................... 07 06932
Apr. 30, 2008 (FR) ..................................... 08 52921

(51) Int. Cl.
F01D 9/06 (2006.01)
C23C 10/48 (2006.01)
F01D 5/18 (2006.01)
C23C 10/08 (2006.01)
C23C 16/04 (2006.01)
(Continued)

(52) U.S. Cl.
CPC .............. *C23C 10/48* (2013.01); *C23C 10/08* (2013.01); *C23C 16/045* (2013.01); *C23C 16/12* (2013.01); *C23C 16/4488* (2013.01); *F01D 5/189* (2013.01); *F01D 5/288* (2013.01); *F01D 9/065* (2013.01); *F05D 2230/313* (2013.01); *F05D 2230/314* (2013.01); *F05D 2300/121* (2013.01); *Y02T 50/67* (2013.01)

(58) Field of Classification Search
None
See application file for complete search history.

(56) References Cited

U.S. PATENT DOCUMENTS 3,486,833 A * 12/1969 Singleton et al. ......... 416/241 R
4,288,201 A    9/1981 Wilson
(Continued)

FOREIGN PATENT DOCUMENTS

EP    1361338 A2 * 11/2003
EP    1 577 415       9/2005
FR    2 830 874       4/2003

OTHER PUBLICATIONS

Gunston, Bill; The Cambridge Aerospace Dictionary; 2004; Cambridge University Press; pp. 411, 682.*

Primary Examiner — Elizabeth A Robinson
Assistant Examiner — Daniel D Lowrey
(74) Attorney, Agent, or Firm — Oblon, McClelland, Maier & Neustadt, L.L.P.

(57) ABSTRACT

An aluminization process by vapor phase deposition for high-temperature oxidation protection of a metal turbomachine part. The part including a cavity into which a metal component is introduced and assembled from an opening in the part. A halide is formed by reaction between a halogen and a metal donor containing aluminum, then the halide is transported by a carrier gas in order to come into contact with the metal part, wherein the metal component has first, before the implementation of the process, been surface-enriched with aluminum in order to serve as an aluminum donor.

9 Claims, 2 Drawing Sheets

(51) Int. Cl.
   *C23C 16/12*     (2006.01)
   *C23C 16/448*    (2006.01)
   *F01D 5/28*      (2006.01)

(56) References Cited

U.S. PATENT DOCUMENTS

| | | | |
|---|---|---|---|
| 5,262,466 A * | 11/1993 | Baldi | 524/430 |
| 5,334,417 A | 8/1994 | Rafferty et al. | |
| 6,730,179 B2 | 5/2004 | Kircher | |
| 6,821,564 B2 | 11/2004 | Das et al. | |
| 7,204,675 B2 * | 4/2007 | Texier | 416/96 A |
| 8,137,749 B2 | 3/2012 | Carlin et al. | |
| 2003/0072878 A1 | 4/2003 | Fournes et al. | |
| 2004/0115355 A1 * | 6/2004 | Bauer et al. | 427/376.1 |
| 2005/0079368 A1 * | 4/2005 | Gorman et al. | 428/469 |
| 2006/0107549 A1 * | 5/2006 | Parent et al. | 34/638 |
| 2011/0014370 A1 | 1/2011 | Brossier et al. | |
| 2012/0177823 A1 | 7/2012 | Brossier et al. | |

* cited by examiner

PROCESS FOR THE VAPOR PHASE ALUMINIZATION OF A TURBOMACHINE METAL PART AND DONOR LINER AND TURBOMACHINE VANE COMPRISING SUCH A LINER

CROSS-REFERENCE TO RELATED APPLICATIONS

This application is a division of U.S. application Ser. No. 12/245,052 now U.S. Pat. No. 8,202,574 filed Oct. 3, 2008, the entire contents of which is incorporated herein by reference. U.S. application Ser. No. 12/245,052 is based upon and claims the benefit of priority from prior French Patent Application Nos. 08-52921 and 07-06932 filed Apr. 30, 2008 and Oct. 3, 2007, respectively.

BACKGROUND OF THE INVENTION

1. Field of the Invention

The present invention relates to the deposition of an aluminum coating on a metal part, especially on a hollow metal part comprising an internal liner. It more particularly targets the application of such a coating to hollow turbomachine vanes incorporating a liner for distributing coolant.

2. Discussion of the Background

A gas turbine engine, such as is used for propulsion in the aeronautical field, comprises an atmospheric air inlet which communicates with one or more compressors, generally including one fan, that are rotated about one and the same axis. The primary stream of this air, after having been compressed, supplies a combustion chamber arranged annularly around this axis and is mixed with a fuel to provide hot gases downstream to one or more turbines through which these gases are expanded, the turbine rotors driving the compression rotors. The engines operate at a temperature of the engine gases at the turbine inlet that is sought to be as high as possible because the performances are linked to it. For this purpose, the materials are chosen to withstand these operating conditions and the walls of parts swept past by the hot gases, such as the nozzles or the rotating turbine blades, are provided with cooling means. Furthermore, due to their metallic composition as superalloy based on nickel or cobalt, it is also necessary to protect them from erosion and corrosion caused by the constituents of the engine gases at these temperatures.

One known means for providing the protection of these parts is to deposit an aluminum-based coating on the surfaces susceptible to attack by the gases. The aluminum is attached to the substrate by metal interdiffusion and forms a protective oxide layer at the surface. The thickness of the coating is of the order of a few tens of microns.

The present invention relates to the technique, known per se, of depositing aluminum in the vapor phase, otherwise known as vapor phase aluminization. According to the process, the parts to be treated are placed in a chamber in which the atmosphere is composed of a mixture of an inert or reducing gas, for example argon or hydrogen, and an active gas comprising an aluminum halide. At the reaction temperature, between 900° C. and 1150° C., the halide decomposes at the surface of the part to gaseous halogen and aluminum which diffuses into the metal.

The halide is produced by placing, in the chamber with the parts to be treated, blocks of aluminum metal or of an aluminum alloy that form the donor, in the presence of granules of a halogen compound, a chlorine or fluorine compound, that form the activator. The inert gas is circulated over the activator at a temperature that allows the sublimation of the halogen which is entrained over the donor and with which it reacts to produce the metal hydride which, at this temperature, is in the vapor form. The halide then decomposes in contact with the metal substrate to be coated, allowing the deposition of aluminum; the gaseous halogen is reformed.

When the stator parts and also the rotor parts are provided with internal cavities through which a coolant and air withdrawn from the compressor travel, it was observed that the walls of these cavities were also subject to corrosion. Returns of parts used in engines operating in certain environments have shown an attack of these surfaces. The following have been found, for example, internal corrosion of the nozzles, releases of flakes of corrosion into the cavity of the nozzles, blocking of the trailing edge vent holes, etc. Protection for these types of parts is therefore also necessary.

The vapor phase aluminization method is particularly suitable a priori for applying a protective coating since the carrier gas and the active components are capable of penetrating into the narrow passages for circulation of the coolant insofar as these passages are open. Reality shows that this is not the case. The thickness of the protective layer is not uniform; it greatly decreases starting from the access orifices of the cavities. Furthermore, accumulations are formed at the vent holes of the cavities, reducing the flow area and the cooling properties of the part.

In Patent Application FR 2830874 in the name of the Applicant, a process is described for the vapor phase aluminization of metal turbomachine parts provided with holes and cavities that communicate with the outside, according to which a gaseous precursor of the deposit to be made comprising an aluminum compound is brought, by means of a carrier gas, into contact with the surfaces of the part placed in a chamber, the carrier gas is either helium or argon and the pressure in the chamber is chosen so that the mean free path of the carrier gas molecules is two times greater than that of the argon molecules under atmospheric pressure. The mean free path of the molecules is usually defined as the ratio $1/P \times D^2$ where P is the pressure in the chamber and D is the molecular diameter.

By lengthening the mean free path of the carrier gas molecules, the diffusion of the halide in the internal channels is increased and the thickness of the deposit in the zones that are less accessible via the conventional method is increased; the overall protection thereof is improved. The increase in the free path results either from the choice of the carrier gas, here helium, or from a reduction in the pressure as can be deduced from the above formula.

SUMMARY OF THE INVENTION

The subject of the invention is a variant of the process that makes it possible to obtain a coating of the walls of the internal cavities over the entire surface with a sufficient thickness.

The invention relates to hollow parts with one cavity and one opening at least through which the cavity communicates with the outside. It relates to such parts, provided with a component such as an internal liner, inside the cavity, introduced through the opening and assembled with the part. Such a part is represented in FIG. 1. This is the cross section of a nozzle of a low-pressure stage in a two-shaft gas turbine engine. The nozzle guide vane 1 comprises a part manufactured by casting metal in a shell mold. This part, hatched in the figure, is formed from a hollow blade 2 between two platforms 3 and 4. The cavity of the blade 2 communicates via its two ends, respectively, on one side with an opening 5 for supplying coolant and, on the other side with a fluid outlet 6. Inside the cavity of the blade 2 a liner 9 of substantially cylindrical shape is positioned. The liner is welded or brazed to the side of the opening 5 for supplying cooling air via a peripheral brazing/welding along the edge of the opening of the cavity. The other end of the liner is introduced into a cylindrical housing that communicates with the outlet 6, without being welded thereto in order to allow the relative expansion of the liner relative to the blade during transient operating steps. The liner is perforated over its length and makes a space with the inner wall of the blade so that cooling air coming from the opening 5 for supplying air passes partly through the perforations of the liner and forms a plurality of air jets that cool the wall of the blade by impact and convection. This air is then discharged via vents arranged in the vicinity of the trailing edge of the blade. The air that has not passed through the wall of the liner is guided toward the opening 6 in order to be conveyed to other parts of the machine.

During manufacture, the liner 9, produced separately from the blade, is introduced into the blade by being slid through the orifice 5 then brazed in the vicinity of the mouth as mentioned above. The lower part, in the figure, remains free to expand and slide in the housing formed by the opening 6.

Conventionally, the aluminization treatment of a part such as the latter is carried out after it has been assembled.

In accordance with the invention, the aluminizing deposition inside the cavity is substantially improved with the following process, that can be applied to any part comprising a component that may be slid through an opening and assembled inside the part.

The aluminization process by vapor phase deposition for high-temperature oxidation protection of a hollow metal turbomachine part, said part comprising a cavity into which a metal component is introduced and assembled from an opening in said part, according to which process a halide is formed by reaction between a halogen and a metal donor containing aluminum, then the halide is transported by a carrier gas in order to come into contact with said metal part, wherein the metal component has first, before the implementation of the process, been surface-enriched with aluminum in order to serve as an aluminum donor.

Providing a donor inside the cavity that is composed of the surface-enriched component allows an effective deposition. In particular the problem of accessibility from the outside of the part is solved while controlling the amount of internal donor.

Specifically, the component is preferably coated with a layer formed by metal deposition. This deposition may have been carried out by any method available to a person skilled in the art: aluminization by vapor phase deposition (SVPA or CVD, aluminization by pack cementation), vacuum deposition (PVD), thermal spraying, electrodeposition or immersion in a bath (dip coating), etc.

In particular the amount of donor is controlled by the thickness of the layer; it is, for example, between 10 µm and 150 µm, preferably between 20 and 90 µm.

The layer contains at least 15 wt % of aluminum but may also comprise at least one element known for its properties of improving the oxidation resistance and that is included in the set (Cr, Hf, Y, Zr, Si, Ti, Ta, Pt, Pd, Ir), in particular the element Cr.

As has been explained above, the process is advantageously suitable for the aluminization treatment of a hollow turbomachine vane. Said component is then composed of the perforated liner for distributing coolant inside the cavity.

The vane is a nozzle guide vane with a blade provided with a cavity and a liner in the cavity. The liner is introduced, after having been enriched with donor metal, via an opening made in one end of the blade. Next, the liner is welded via one end to the wall of the blade on the side of the opening for introducing the liner into the cavity. The liner is, for example, made of a cobalt-based alloy for the mechanical properties of the latter of resistance to vibrations and to friction.

The use of an aluminum-donor liner is particularly advantageous insofar as the quality of the internal coating of the cavities of the vanes is substantially improved without having to modify the conventional gas-phase aluminization process. The vane and the donor liner are assembled in almost the same way as a vane with a non-aluminized liner, the only modification relating to the brazed zone which preferably must remain uncoated, then it is aluminized in the conventional manner.

The vanes comprising a donor liner may be nozzle guide vanes for the high-pressure stages of the turbine of a gas turbine engine or else for the low-pressure stages of the turbine of such an engine.

BRIEF DESCRIPTION OF THE DRAWINGS

A nonlimiting embodiment of the invention will now be described with reference to the drawings, in which.

DETAILED DESCRIPTION OF THE PREFERRED EMBODIMENTS

Figure 1:
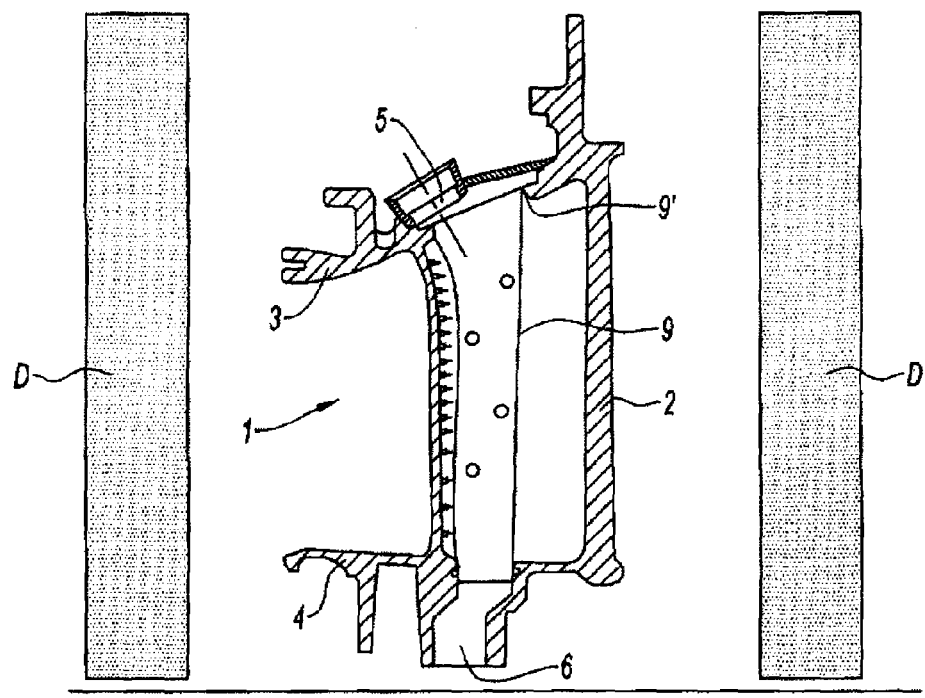
FIG. 1 represents a nozzle guide vane with an internal cavity and a liner for distributing cooling air introduced into this cavity.
Figure 2:
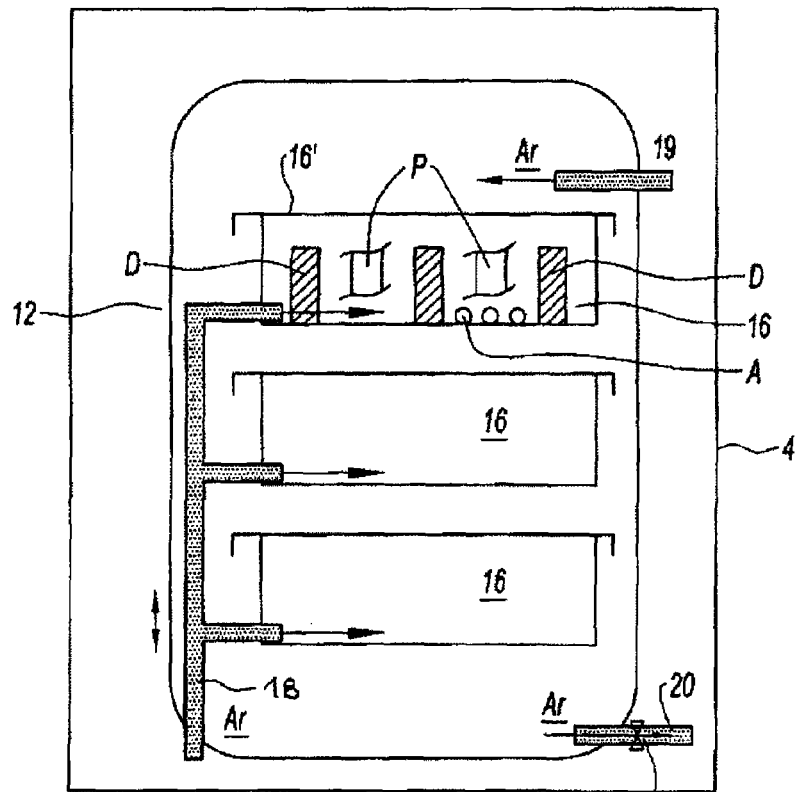
FIG. 2 shows an aluminization installation that is suitable for implementing the process of the invention.

FIG. 2 shows very schematically a conventional vapor phase aluminization installation in which the process of the invention is carried out.

A chamber 12 is mounted inside a furnace 4 capable of heating the parts to a temperature of 1200° C. Placed in this chamber are boxes 16, here three superposed boxes, with a cover 16'. These boxes contain the parts to be treated P, for example turbine nozzles, with the metal donor D in powder form or in the form of blocks and the activator A. The chamber 12 comprises a purging carrier gas supply 18, a flushing carrier gas supply 19 and an outlet 20 controlled by a valve 21.

After having positioned the parts, the donor and the activator in the boxes 16, the chamber 12 is first purged by introducing the carrier gas, for example argon, through the conduit 18. The supply is interrupted when the air in the chamber has been replaced by argon. Next, the furnace is heated while supplying the chamber with argon via the conduit 19. The excess gas is discharged via the conduit 20. At the activation temperature of the activator A, the halogen, chlorine or fluorine, is released. By coming into contact with the donor, the halogen reacts with the metal and forms a halide. The halide vapor thus formed circulates inside the boxes 16 and comes into contact with the metal parts P. At this moment, the halide decomposes and releases the metal which is deposited on the part.

The argon is continuously introduced, as a gentle flushing, via the conduit 19 into the chamber 12 and is discharged via the conduit 20. The treatment time is between 2 and 6 hours.

In accordance with the invention, the donor is brought together with the cavity by using the liner as a donor.

Prior to the aluminization treatment, the part is prepared by assembling an aluminum-enriched liner and the part that has just been cast. The liner is introduced through the passage 5 for supplying cooling air in the blade. Next, the upper edge 9' of the liner 9 is brazed to the wall of the opening in the blade.

The liner has been enriched with aluminum by any means available to a person skilled in the art. The mode of applying the coating to this liner may be that described by the patent itself (vapor phase aluminization), the liners replacing the parts to be treated P in the chamber 12 of the SVPA furnace 4.

The liner may thus have itself been treated beforehand by vapor phase aluminization for the purpose of producing a layer over the entire surface. The thickness of the layer is determined so as to have a sufficient amount of aluminum to react with the halogen and form a vapor-phase halide during the aluminization operation of the part. As the donor is close to the surfaces to be treated, the deposition obtained is greater than that which could be obtained by the conventional method.

The advantage of this solution relative to another solution, which might consist in placing a donor basket inside the cavity, is in enabling the part that has already been assembled to be treated. The use of a basket in an intermediate step would make it necessary to treat the part without the liner then to mount the liner on the part, the walls of which are coated with a layer of aluminum, which requires a particular adaptation of the brazing means.

Furthermore, it is not necessary to develop a specific technique for cleaning the inside of the cavity of donor residues.

Figure 3:
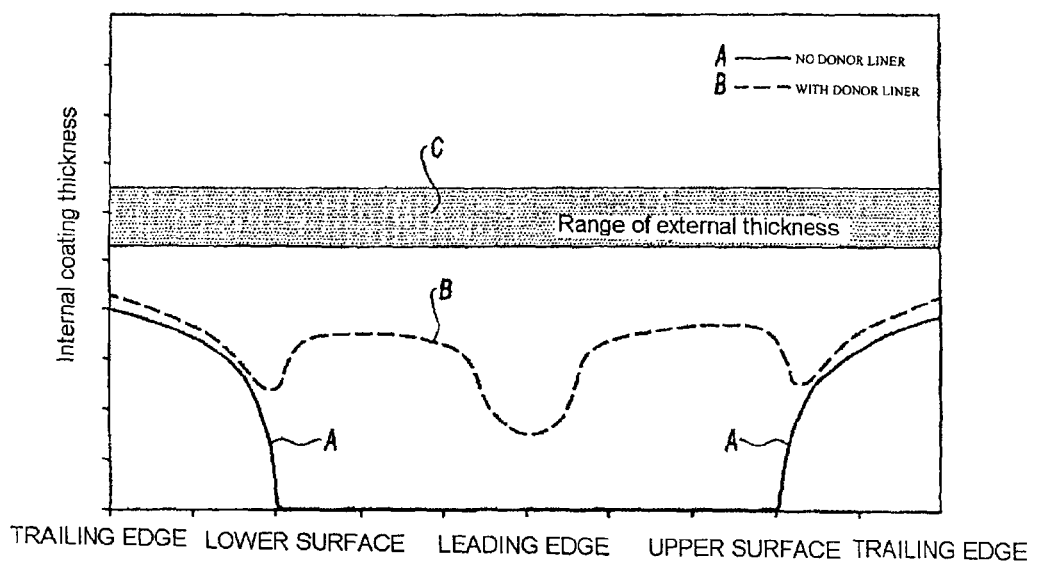
FIG. 3 shows the coating thickness obtained internally both by the prior art technique and the technique according to the invention.

In FIG. 3 the distribution, on the y-axis, of the thickness of the coating obtained on the walls of the cavity is represented. The curve A corresponding to the prior art shows that the coating is very poorly distributed between the leading edge and the trailing edge both along the lower surface and the upper surface. The curve B represents the thickness of the coating obtained with the donor liner. It is more homogeneous and non-zero. The zone C shows the external thickness.

The invention claimed is:

1. A hollow turbomachine vane including a liner for distributing cooling air,
   the liner being cylindrical,
   the liner including a first end which is welded or brazed to a coolant supplying opening of the vane and a second end which is introduced into and not welded to a housing which communicates with an outlet of the vane, and
   a surface of the liner being coated, at least partially, with a layer of at least 15 weight percent of aluminum,
   wherein a thickness of the layer of aluminum is determined so as to have a sufficient amount of aluminum to react with a halogen to form a vapor-phase halide during an aluminization operation of an internal surface of the vane, and
   wherein the internal surface of the vane is free of a coating comprising aluminum.

2. The vane as claimed in claim 1, wherein the aluminum layer is between 10 and 150 μm.

3. The vane as claimed in claim 2, wherein the aluminum layer is between 20 and 90 μm.

4. A turbomachine nozzle comprising the hollow vane of claim 1.

5. The vane as claimed in claim 1, wherein the liner is perforated with at least one perforation.

6. The vane as claimed in claim 5, wherein a space is provided between the liner and an inner wall of the vane such that cooling air coming from the coolant supplying opening passes through at least one perforation of the liner to form air jets.

7. The vane as claimed in claim 1, wherein the liner comprises a cobalt-based alloy.

8. The vane as claimed in claim 1, wherein the layer which coats the liner further comprises at least one of Cr, Hf, Y, Zr, Si, Ti, Ta, Pt, Pd, and Ir.

9. The vane as claimed in claim 1, wherein a zone of the surface of the liner that is brazed is uncoated.

* * * * *